United States Patent
Torfs et al.

(10) Patent No.: US 11,098,215 B2
(45) Date of Patent: Aug. 24, 2021

(54) SOLDER MASK INKJET INKS FOR MANUFACTURING PRINTED CIRCUIT BOARDS

(71) Applicants: AGFA-GEVAERT NV, Mortsel (BE); ELECTRA POLYMER LTD., Tonbridge Kent (GB)

(72) Inventors: Rita Torfs, Mortsel (BE); Hubertus Van Aert, Mortsel (BE); Johan Loccufier, Mortsel (BE); Marion Sauvageot, Mortsel (BE)

(73) Assignees: AGFA-Gevaert, Mortsel (BE); Electra Polymer Ltd., Kent (GB)

( * ) Notice: Subject to any disclaimer, the term of this patent is extended or adjusted under 35 U.S.C. 154(b) by 100 days.

(21) Appl. No.: 16/348,161

(22) PCT Filed: Nov. 7, 2017

(86) PCT No.: PCT/EP2017/078391
§ 371 (c)(1),
(2) Date: May 8, 2019

(87) PCT Pub. No.: WO2018/087056
PCT Pub. Date: May 17, 2018

(65) Prior Publication Data
US 2019/0367758 A1    Dec. 5, 2019

(30) Foreign Application Priority Data

Nov. 10, 2016    (EP) .................................... 16198091

(51) Int. Cl.
| | | |
|---|---|---|
| C09D 11/38 | (2014.01) | |
| C09D 11/037 | (2014.01) | |
| C09D 11/101 | (2014.01) | |
| C09D 11/107 | (2014.01) | |
| C09D 11/322 | (2014.01) | |
| H05K 1/09 | (2006.01) | |
| H05K 3/00 | (2006.01) | |
| H05K 3/28 | (2006.01) | |

(52) U.S. Cl.
CPC ............ *C09D 11/38* (2013.01); *C09D 11/037* (2013.01); *C09D 11/101* (2013.01); *C09D 11/107* (2013.01); *C09D 11/322* (2013.01); *H05K 1/092* (2013.01); *H05K 3/0076* (2013.01); *H05K 3/287* (2013.01); *H05K 2203/013* (2013.01)

(58) Field of Classification Search
CPC ....... C09D 11/38; C09D 11/36; C09D 11/101; C09D 11/107; C09D 11/322; C09D 11/037; H05K 1/092; H05K 3/0078; H05K 23/287; H05K 2203/013
See application file for complete search history.

(56) References Cited

U.S. PATENT DOCUMENTS

| | | | | |
|---|---|---|---|---|
| 7,332,254 | B2 * | 2/2008 | Sasaki | G03F 7/0226 430/18 |
| 8,309,295 | B2 * | 11/2012 | Sasaki | G03F 7/0388 430/270.1 |
| 10,066,118 | B2 * | 9/2018 | Tanikawa | C09D 133/10 |
| 2006/0047014 | A1 * | 3/2006 | Hopper | C09D 11/36 523/160 |
| 2009/0163615 | A1 * | 6/2009 | Halahmi | C09D 11/36 522/146 |
| 2011/0190429 | A1 * | 8/2011 | Muhammad | H05K 3/285 524/114 |

FOREIGN PATENT DOCUMENTS

| | | |
|---|---|---|
| EP | 1 543 704 A1 | 6/2005 |
| EP | 1 624 001 A1 | 2/2006 |
| EP | 2 725 075 A1 | 4/2014 |
| EP | 2 809 735 A1 | 12/2014 |
| EP | 3 000 853 A1 | 3/2016 |
| EP | 3 067 374 A1 | 9/2016 |

OTHER PUBLICATIONS

Official Communication issued in International Patent Application No. PCT/EP2017/078391, dated Jan. 10, 2018.

* cited by examiner

*Primary Examiner* — Sanza L. McClendon
(74) *Attorney, Agent, or Firm* — Leydig, Voit & Mayer, Ltd.

(57) ABSTRACT

An inkjet method for producing a solder mask in the manufacture of a Printed Circuit Board uses a solder mask inkjet ink containing a polymerizable adhesion promoter and a phenolic compound including at least two phenolic groups. A high quality solder mask withstanding the high thermal stress during the soldering process while maintaining excellent physical properties is produced.

15 Claims, No Drawings

SOLDER MASK INKJET INKS FOR MANUFACTURING PRINTED CIRCUIT BOARDS

CROSS REFERENCE TO RELATED APPLICATIONS

This application is a 371 National Stage Application of PCT/EP2017/078391, filed Nov. 7, 2017. This application claims the benefit of European Application No. 16198091.7, filed Nov. 10, 2016, which is incorporated by reference herein in its entirety.

BACKGROUND OF THE INVENTION

1. Field of the Invention

The present invention relates to a solder mask inkjet ink and an inkjet method for manufacturing Printed Circuit Boards.

2. Description of the Related Art

Inkjet printing methods have been proposed to further improve the manufacturing process of Printed Circuit Boards (PCBs).

Inkjet printing methods and inkjet inks have been disclosed for legend printing in for example EP-A 2725075 (Agfa) and for applying an etch resist on a copper surface in for example EP-A 2809735 (Agfa) and EP-A 3000853 (Agfa).

By reducing the complexity and minimizing the waste such inkjet printing methods render the manufacture of PCBs more cost effective.

Also for applying the solder mask, inkjet printing methods have been disclosed in for example EP-A 1543704 (Avecia) and EP-A 1624001 (Taiyo Ink Manufacturing).

Solder masks are permanent protective coatings that perform a number of functions during the fabrication, assembly and end use of PCBs. One of the main purposes of solder mask is to protect the circuitry from interacting with solder during the assembly process. A solder mask's job isn't solely restricted to the solder operation however, as it also helps to protect the laminate, holes and traces from collecting contaminants and from degrading during the service life of the PCB. A solder mask also acts as an insulator of known dielectric property between components and traces of the PCB.

UV curable inks are preferred for the design of solder mask inks as they allow a high crosslinking degree, resulting in excellent chemical resistance and mechanical properties. However, compatibility with the high temperature soldering process, while maintaining all physical properties, is especially challenging.

The solder mask inkjet inks disclosed in EP-A 1513704 include an adhesion promoter, which is preferably a (meth)acrylate containing an acid such as for example 2-carboxyethylacrylate.

In EP-A 1624001 the solder mask inkjet ink comprises a monomer having a (meth)acryloyl group and a thermosetting functional group selected from the group consisting of a hydroxyl group, a carboxyl group, an isocyanate group, an amino group, an imino group, an epoxy group, an oxetanyl group, a mercapto group, a methoxymethyl group, a methoxyethyl group, an ethoxymethyl group, an ethoxyethyl group, and an oxazoiline group.

There is still a need for designing solder mask inkjet inks, which are able to withstand the high thermal stress induced during the soldering process in the manufacture of PCBs.

SUMMARY OF THE INVENTION

Preferred embodiments of the invention provide a solder mask inkjet ink wherewith a high quality solder mask, in particular withstanding the high thermal stress during the soldering process while maintaining excellent physical properties, may be produced.

The advantages and benefits of the invention are realized by the solder mask inkjet ink defined below.

Further objects of the invention will become apparent from the description hereinafter.

DETAILED DESCRIPTION OF THE PREFERRED EMBODIMENTS

Definitions

The term "monofunctional" in e.g. monofunctional polymerizable compound means that the polymerizable compound includes one polymerizable group.

The term "difunctional" in e.g. difunctional polymerizable compound means that the polymerizable compound includes two polymerizable groups.

The term "polyfunctional" in e.g. polyfunctional polymerizable compound means that the polymerizable compound includes more than two polymerizable groups.

The term "alkyl" means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethyl-propyl and 2-methyl-butyl, etc.

Unless otherwise specified a substituted or unsubstituted alkyl group is preferably a $C_1$ to $C_6$-alkyl group.

Unless otherwise specified a substituted or unsubstituted alkenyl group is preferably a $C_2$ to $C_6$-alkenyl group.

Unless otherwise specified a substituted or unsubstituted alkynyl group is preferably a $C_2$ to $C_6$-alkynyl group.

Unless otherwise specified a substituted or unsubstituted aralkyl group is preferably a phenyl or naphthyl group including one, two, three or more $C_1$ to $C_6$-alkyl groups.

Unless otherwise specified a substituted or unsubstituted alkaryl group is preferably a $C_7$ to $C_{20}$-alkyl group including a phenyl group or naphthyl group.

Unless otherwise specified a substituted or unsubstituted aryl group is preferably a phenyl group or naphthyl group.

Unless otherwise specified a substituted or unsubstituted heteroaryl group is preferably a five- or six-membered ring substituted by one, two or three oxygen atoms, nitrogen atoms, sulphur atoms, selenium atoms or combinations thereof.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

Unless otherwise specified a substituted alkyl group, a substituted alkenyl group, a substituted alkynyl group, a substituted aralkyl group, a substituted alkaryl group, a substituted aryl and a substituted heteroaryl group are preferably substituted by one or more constituents selected from the group consisting of methyl, ethyl, n-propyl, isopropyl, n-butyl, isobutyl and tertiary-butyl, ester, amide, ether, thioether, ketone, aldehyde, sulfoxide, sulfone, sulfonate ester, sulphonamide, —Cl, —Br, —I, —OH, —SH, —CN and —$NO_2$.

Manufacture of an Electronic Device

The method of manufacturing an electronic device according to the present invention includes the steps of:
 jetting a radiation curable solder mask inkjet ink as described below on a dielectric substrate containing an electrically conductive pattern; and
 curing the jetted solder mask inkjet ink.

The electronic device is preferably a Printed Circuit Board.

The radiation curable solder mask inkjet ink may be cured by exposing the ink to actinic radiation, such as electron beam or ultraviolet (UV) radiation.

Preferably the radiation curable inkjet ink is cured by UV radiation, more preferably using UV LED curing.

The method preferably includes a thermal treatment. The thermal treatment is preferably carried out after the curing step.

In a preferred embodiment the thermal treatment is carried out at a temperature from 80° C. to 250° C. The temperature is preferably not less than 100° C., more preferably not less than 120° C. To prevent charring of the solder mask, the temperature is preferably not greater than 200° C., more preferably not greater then 160° C.

The thermal treatment is typically carried out between 15 and 90 minutes.

The purpose of the thermal treatment is to further increase the polymerization degree of the solder mask.

This further polymerization during the thermal treatment may be accelerated by adding radical initiators which promote thermal curing of polymers, such as peroxides and azo compounds, to the solder mask inkjet ink.

The dielectric substrate of the electronic device may be any non-conductive material. The substrate is typically a paper/resin composite or a resin/fibre glass composite, a ceramic substrate, a polyester or a polyimide.

The electrically conductive pattern is typically made from any metal or alloy which is conventionally used for preparing electronic devices such as gold, silver, palladium, nickel/gold, nickel, tin, tin/lead, aluminium, tin/aluminium and copper. The electrically conductive pattern is preferably made from copper.

Radiation Curable Solder Mask Inkjet Ink

The radiation curable solder mask inkjet ink comprises an adhesion promoter and a phenolic compound both as described below. The inkjet ink may further comprise a polymerizable compound, a colorant, a polymeric dispersant, a photoinitiater or photoinitiating system, a polymerization inhibitor, or a surfactant. The radiation curable solder mask inkjet ink comprises may also comprise a flame retardant.

The solder mask inkjet ink can be cured by e-beam, but is preferably cured by UV light, more preferably by UV light from UV LEDs. The solder mask inkjet ink is thus preferably a UV curable inkjet ink.

For reliable industrial inkjet printing, the viscosity of the radiation curable inkjet inks is preferably no more than 20 mPa·s at 45° C., more preferably between 1 and 18 mPa·s at 45° C., and most preferably between 4 and 14 mPa·s at 45° C.

For good image quality and adhesion, the surface tension of the radiation curable inkjet inks is preferably in the range of 18 to 70 mN/m at 25° C., more preferably in the range of 20 to 40 mN/m at 25° C.

The radiation curable solder mask inkjet ink may further comprise a polymerizable compound, a colorant, a polymeric dispersant, a photoinitiater or photoinitiating system, a polymerization inhibitor, or a surfactant. The radiation curable solder mask inkjet ink comprises may also comprise a flame retardant.

Adhesion Promoter

The adhesion promoter according to the present invention has a structure according to Formula I (or salt thereof),

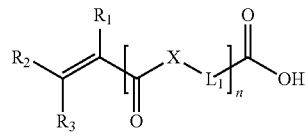

Formula I wherein
n is 0 or 1,
$R_1$ is selected from the group consisting of a hydrogen atom, a substituted or unsubstituted alkyl group and a substituted or unsubstituted aryl group.
$L_1$ represents a divalent linking group, comprising 20 carbon atoms or less, with the proviso that $L_1$ is linked to the carboxylic acid via an aliphatic carbon atom,
X represents O or $NR_4$,
$R_4$ is selected from the group consisting of a hydrogen atom, a substituted or unsubstituted alkyl group, a substituted or unsubstituted alkenyl group, a substituted or unsubstituted alkynyl group, a substituted or unsubstituted alkaryl group, a substituted or unsubstituted aralkyl group and a substituted or unsubstituted (hetero) aryl group,
$R_4$ and L1 may represent the necessary atoms to form a 5 to 8 membered ring.
$R_2$ and $R_3$ are independently selected from the group consisting of hydrogen, a substituted or unsubstituted alkyl group, a substituted or unsubstituted aryl group and a substituted or unsubstituted heteroaryl group.

$R_1$ is preferably a hydrogen atom or a substituted or unsubstituted C1 to C4 alkyl group, more preferably a hydrogen atom or a methyl group, a hydrogen atom being particularly preferred.

X is preferably an oxygen atom or NH, an oxygen atom being particularly preferred.

$L_1$ preferably represents a substituted or unsubstituted alkylene group, an unsubstituted alkylene group being particularly preferred.

In a preferred embodiment, n is 1 and R1 represents a hydrogen atom or a C1 to C4 alkyl group.

In another preferred embodiment, n is 0 and R1 represent

The adhesion promoter according to Formula I, or a salt thereof, may copolymerize with other polymerizable compounds of the radiation curable inkjet ink.

Examples of adhesion promoters according to the present invention are given in Table 1 without being limited thereto.

TABLE 1

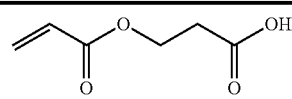

ADH-1

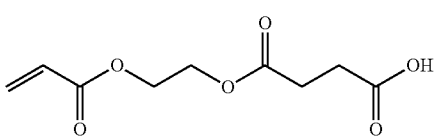

ADH-2

TABLE 1-continued

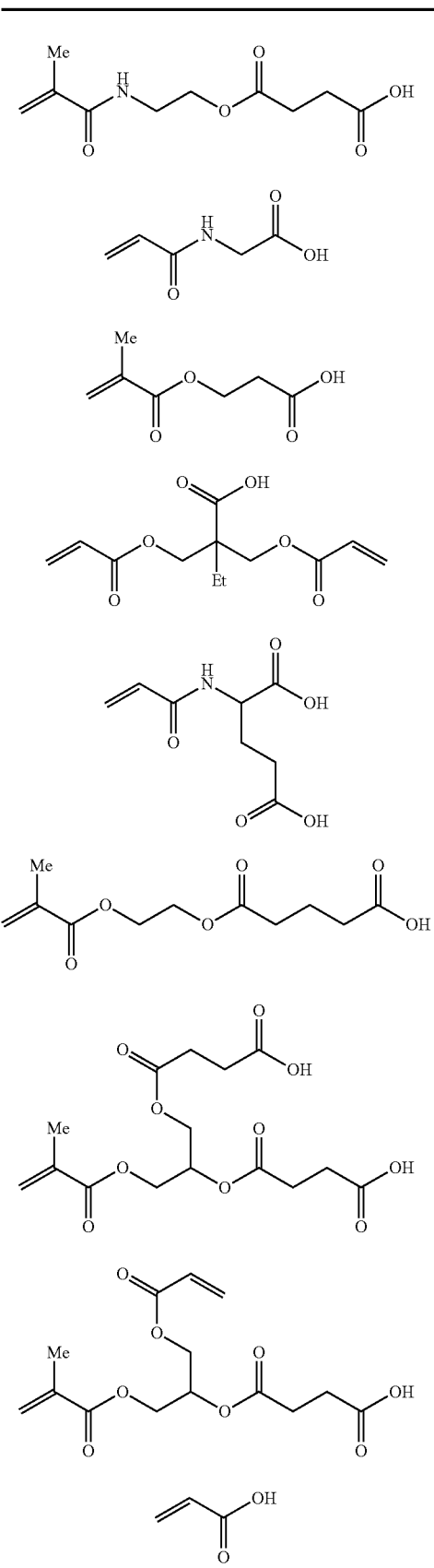

| | |
|---|---|
| | ADH-3 |
| | ADH-4 |
| | ADH-5 |
| | ADH-6 |
| | ADH-7 |
| | ADH-8 |
| | ADH-9 |
| | ADH-10 |
| | ADH-11 |

TABLE 1-continued

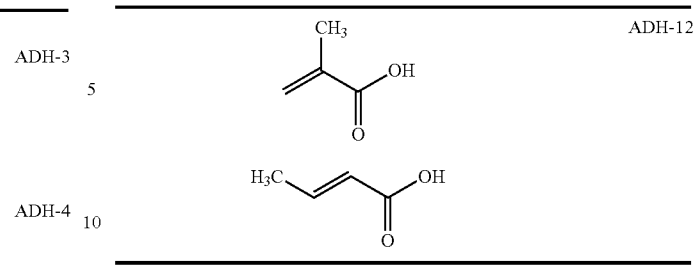

ADH-12

The radiation curable solder mask inkjet ink may in addition to the adhesion promoter described above comprise other adhesion promoters, for examples those disclosed in WO2004/028225.

The amount of adhesion promoter in the radiation curable solder mask inkjet ink is preferably between 0.5 and 20 wt %, more preferably between 1 and 15 wt %, most preferably between 2.5 and 10 wt %, relative to the total weight of the inkjet ink.

Phenolic Compound

The phenolic compound according to the present invention comprises at least two phenolic groups. The phenolic compound may comprises two, three, four or more phenolic groups.

A preferred phenolic compound comprises two phenolic groups.

A particular preferred phenolic compound has a structure according to Formula II:

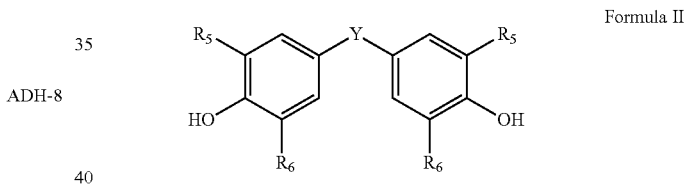

Formula II wherein,
$R_5$ and $R_6$ are independently selected from the group consisting of a hydrogen atom, a substituted or unsubstituted alkyl group, a hydroxyl group and a substituted or unsubstituted alkoxy group,
Y is selected from the group consisting of $CR_7R_8$, $SO_2$, SO, S, O and CO,
$R_7$ and $R_8$ are independently selected from the group consisting of a hydrogen atom, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, a substituted or unsubstituted (hetero)aryl group,
$R_7$ and $R_8$ may represent the necessary atoms to form a 5 to 8 membered ring.
Y is preferably $CR_7R_8$ or $SO_2$, $R_7$ an $R_8$ preferably represent a hydrogen atom or an alkyl group.

In another preferred embodiment, the phenolic compound is a polymer comprising at least two phenolic groups. Preferably, the polymer comprising at least two phenolic groups is a branched or hyperbranched polymer.

A preferred polymer comprising at least two phenolic groups is a phenolic resin, i.e. a novolac or a resole.

Phenolic resins are reaction products of phenolic compounds with aldehydes or ketones. Phenols which could be used are: phenol, o-cresol, p-cresol, m-cresol, 2,4-xylenol, 3,5-xylenol, or 2,5-xylenol. Aldehydes which can be used are formaldehyde, acetaldehyde, or acetone.

The most widely used method for novolac preparation is the acid-catalysed one-step synthesis of phenol/cresol and formaldehyde, which leads to a statistical structure of resin (see reaction scheme below).

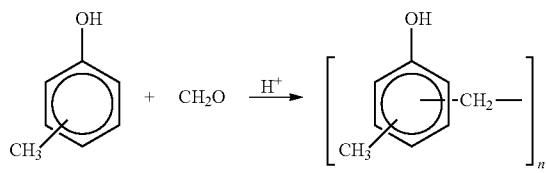

Generally, hydrochloric acid, sulfuric acid, p-toluene sulfuric acid or oxalic acid is used as catalyst. Various proportions of formaldehyde and phenol/cresol are usually employed in regular novolac resins. Higher phenol contents increase the degree of branching whereas reaction can take place at the ortho and para-positions. For resins with a higher p-cresol content more linear polymers are obtained due to that the para-position is blocked by presence of the methyl group.

Novolac copolymers of phenol and formaldehyde will have a high degree of branching, since reaction takes place both an ortho- and para-positions. In order to reduce the viscosity a high degree of branching and/or low molecular weights are preferred. For cresolic novolacs the use of m-cresol can give easier high molecular weights as compared to o-cresol and p-cresol.

Phenolic resins can also be prepared in base catalyzed reactions, which lead to the formation of resoles. Resoles are phenolic polymers having also methylol groups.

For incorporation in the solder mask inkjet ink, preference is given to novolac resins to obtain a sufficient ink stability since novolac resins are only reactive at high temperatures (>150 C). Resoles may react already at lower temperatures and due to the presence of methylol groups may result in a poorer chemical resistance of the inkjet ink.

More well defined branched polymers having at least two phenolic groups may be prepared using 4-hydroxyphenyimethylcarbinol, as disclosed in U.S. Pat. No. 5,554,719 and US2005250042. A particular preferred branched polymer having at least two phenolic groups prepared from 4-hydroxyphenylmethylcarbinol has been developed by Du Pont Electronic Polymers and is supplied by Hydrite Chemical Company under the tradename PSH-B or PB-5 (CASRN 166164-76-7).

Examples of phenolic compounds according to the present invention are given in Table 2 without being limited thereto.

TABLE 2

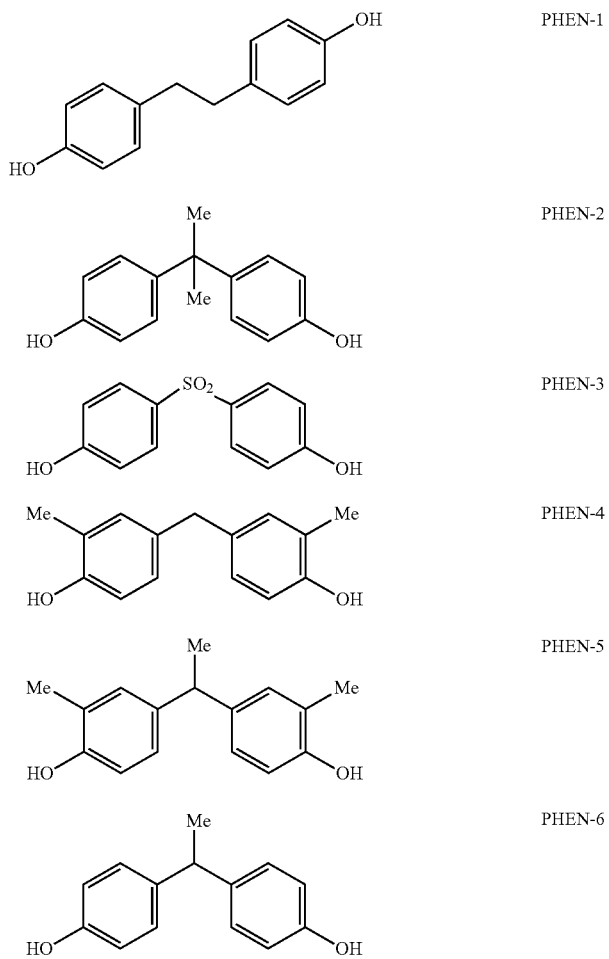

TABLE 2-continued

| Structure | Label |
|---|---|
| (4,4'-thiodiphenol) | PHEN-7 |
| (4,4'-oxydiphenol) | PHEN-8 |
| (1,1-bis(4-hydroxyphenyl)cyclohexane) | PHEN-9 |
| (butane-1,4-diyl bis(4-hydroxybenzoate)) | PHEN-10 |
| (ethane-1,2-diyl bis(3,4-dihydroxybenzoate)) | PHEN-11 |
| (1,2-bis(4-hydroxyphenoxy)ethane) | PHEN-12 |
| (bis-methylolated bisphenol, methyl-substituted) | PHEN-12 |
| (bis-methylolated tetramethyl bisphenol) | PHEN-13 |
| (bis-methylolated dimethyl bisphenol) | PHEN-14 |

TABLE 2-continued
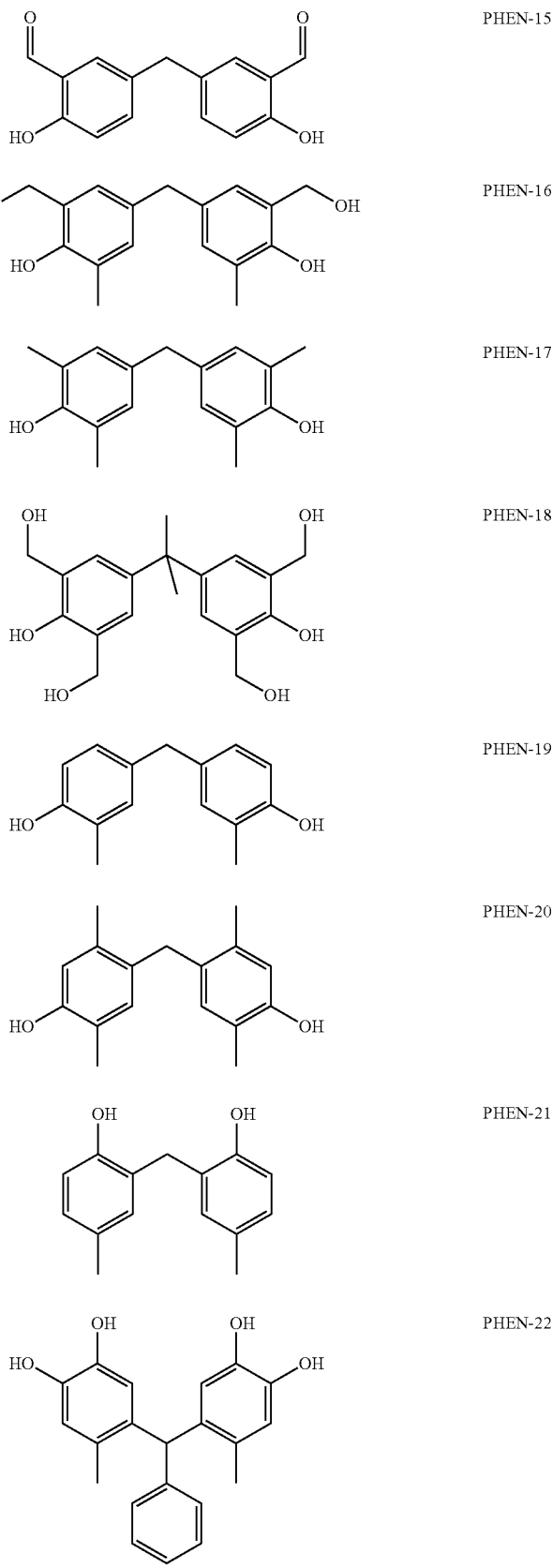
PHEN-15
PHEN-16
PHEN-17
PHEN-18
PHEN-19
PHEN-20
PHEN-21
PHEN-22

TABLE 2-continued
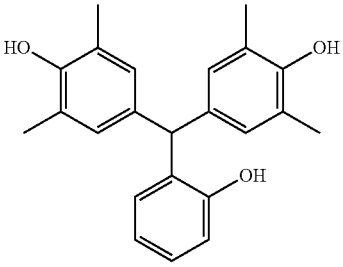 [SMILES: Cc1cc(C(c2cc(C)c(O)c(C)c2)c2ccccc2O)cc(C)c1O] PHEN-23
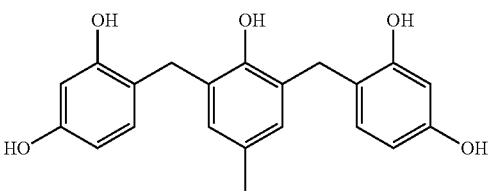 [SMILES: Cc1cc(Cc2ccc(O)cc2O)c(O)c(Cc2ccc(O)cc2O)c1] PHEN-24
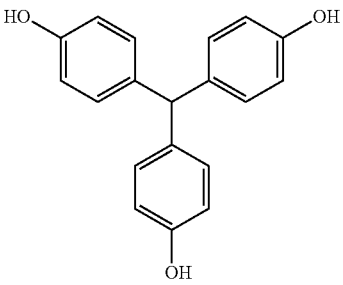 [SMILES: Oc1ccc(C(c2ccc(O)cc2)c2ccc(O)cc2)cc1] PHEN-25
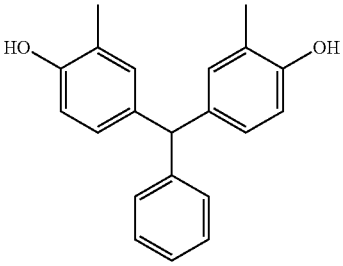 [SMILES: Cc1cc(C(c2ccccc2)c2ccc(O)c(C)c2)ccc1O] PHEN-26
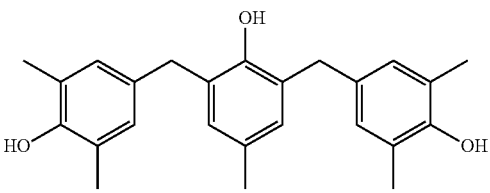 [SMILES: Cc1cc(Cc2cc(C)c(O)c(C)c2)c(O)c(Cc2cc(C)c(O)c(C)c2)c1] PHEN-27
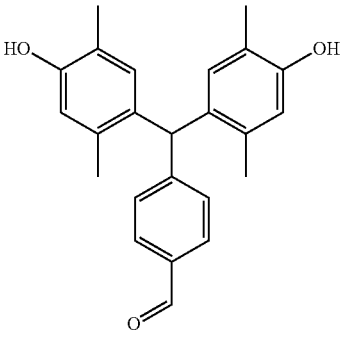 [SMILES: Cc1cc(C(c2ccc(C=O)cc2)c2cc(C)c(O)cc2C)c(C)cc1O] PHEN-28

TABLE 2-continued
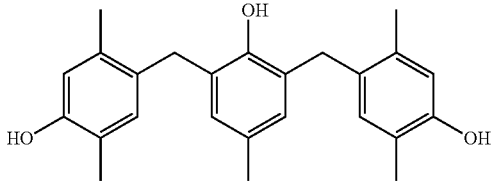 [SMILES: Cc1cc(Cc2cc(C)c(O)cc2C)c(O)c(Cc2cc(C)c(O)cc2C)c1] PHEN-29
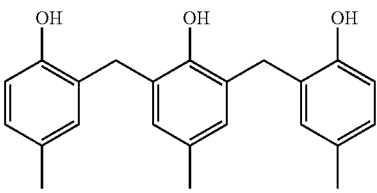 [SMILES: Cc1ccc(O)c(Cc2cc(C)cc(Cc3cc(C)ccc3O)c2O)c1] PHEN-30
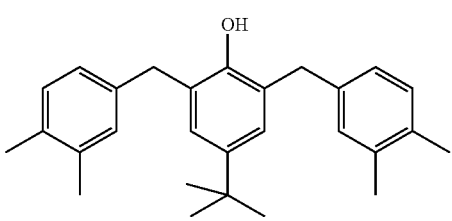 PHEN-31
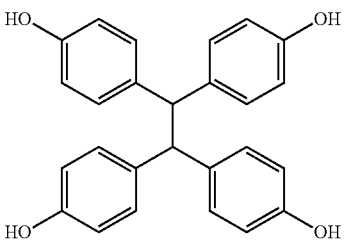 [SMILES: Oc1ccc(C(c2ccc(O)cc2)C(c2ccc(O)cc2)c2ccc(O)cc2)cc1] PHEN-32
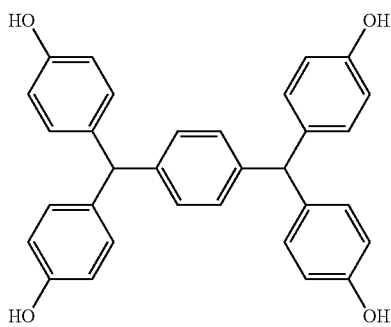 [SMILES: Oc1ccc(C(c2ccc(O)cc2)c2ccc(C(c3ccc(O)cc3)c3ccc(O)cc3)cc2)cc1] PHEN-33
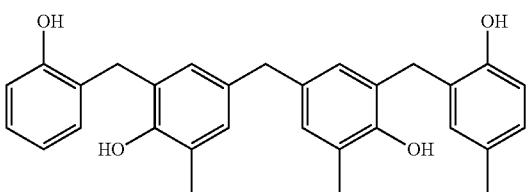 [SMILES: Cc1ccc(O)c(Cc2cc(Cc3cc(C)c(O)c(Cc4ccccc4O)c3)cc(C)c2O)c1] PHEN-34
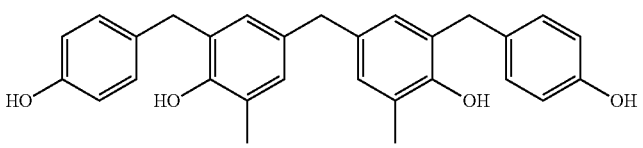 [SMILES: Cc1cc(Cc2cc(C)c(O)c(Cc3ccc(O)cc3)c2)cc(Cc2ccc(O)cc2)c1O] PHEN-35

TABLE 2-continued
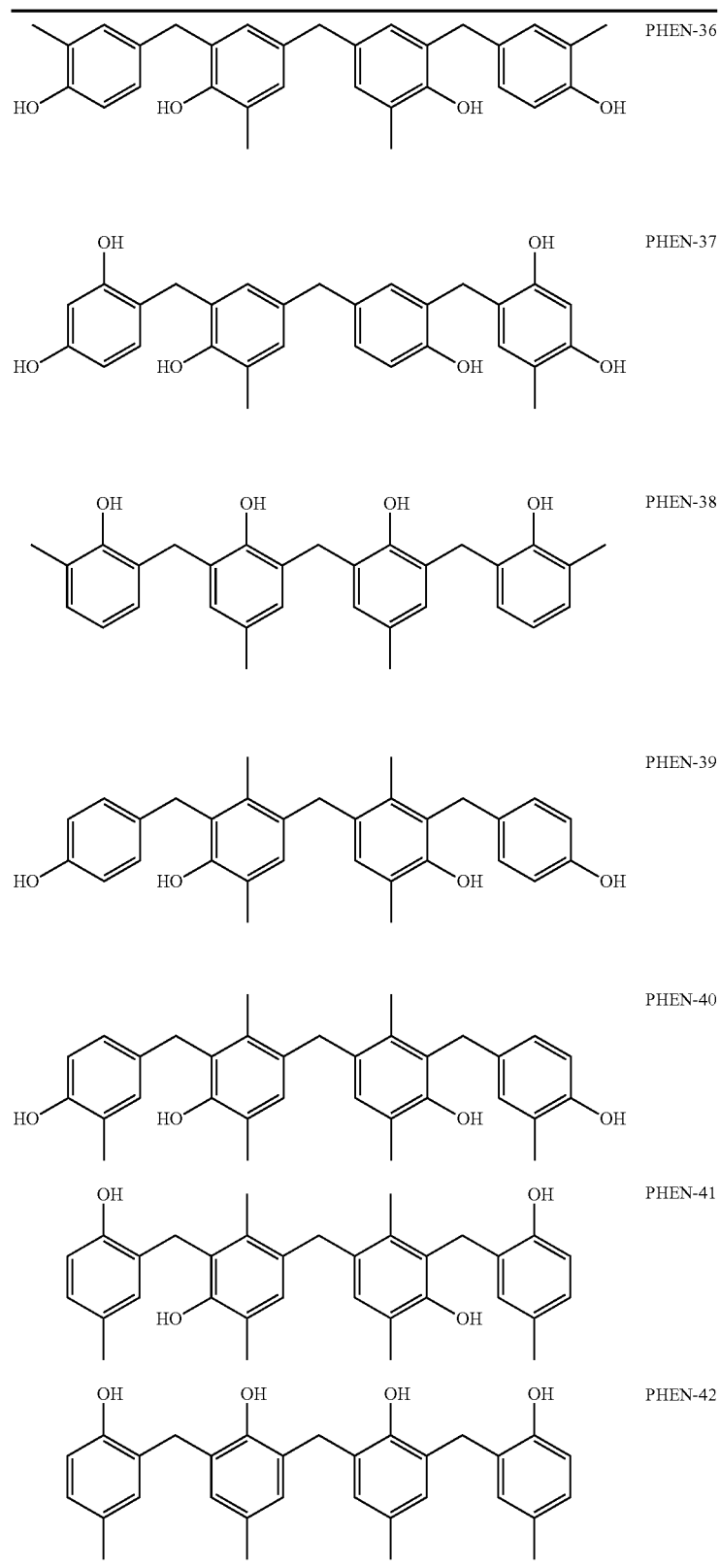
Typical examples of polymers having at least two phenolic groups are given in Table 3 below without being limited thereto.

TABLE 3
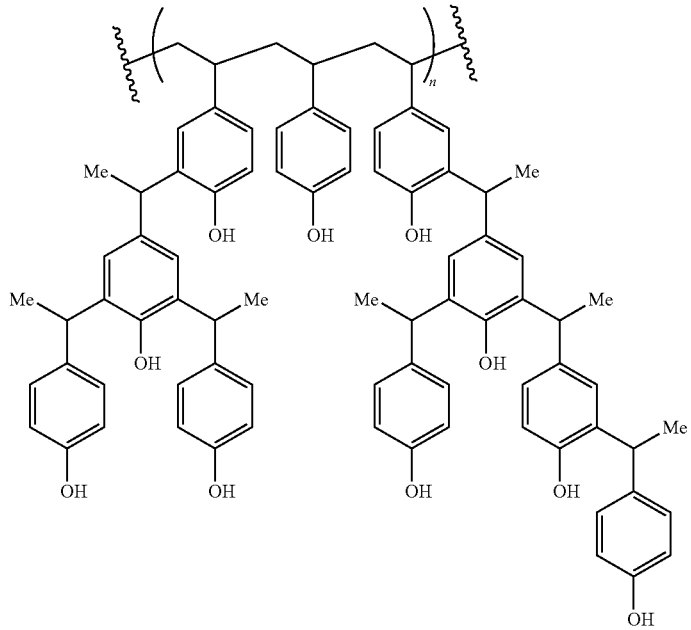
RESIN-1
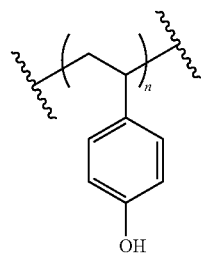
RESIN-2
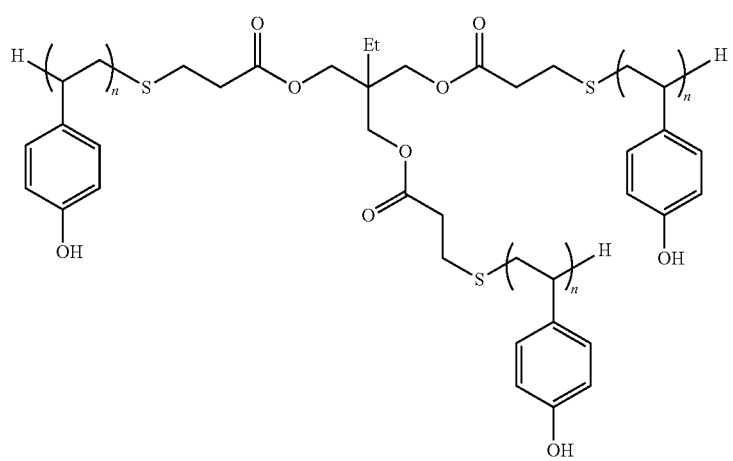
RESIN-3

TABLE 3-continued

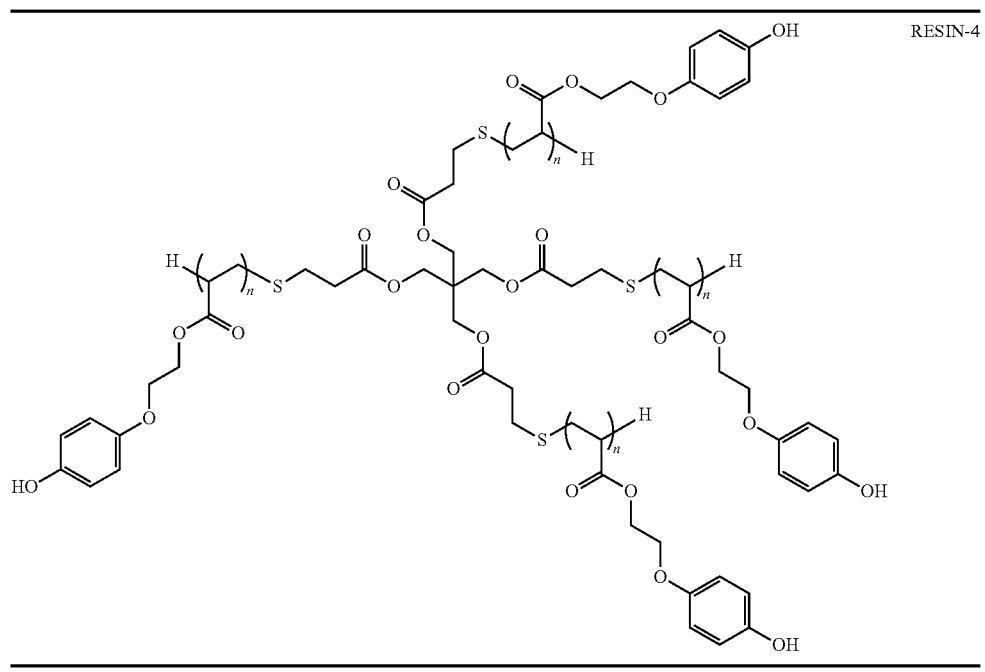
RESIN-4

The amount of phenolic compounds is preferably between 0.5 and 20 wt %, more preferably between 1 and 15 wt %, most preferably between 2.5 and 10 wt %, relative to the total weight of the inkjet ink.

Polymerizable Compounds

The free radical polymerizable compounds may be monomers, oligomers and/or prepolymers.

These monomers, oligomers and/or prepolymers may possess different degrees of functionality. A mixture including combinations of mono-, di-, tri- and higher functional monomers, oligomers and/or prepolymers may be used. The viscosity of the radiation curable inkjet ink may be adjusted by varying the ratio between the monomers and oligomers.

In a preferred embodiment, the monomer, oligomer or polymer includes at least one acrylate group as polymerizable group.

Preferred monomers and oligomers are those listed in paragraphs [0106] to [0115] in EP-A 1911814.

In a preferred embodiment, the radiation curable inkjet ink comprises a monomer containing a vinylether group and an acrylate or methacrylate group. Such monomers are disclosed in EP-A 2848659, paragraphs [0099] to [0104]). A particular preferred monomer containing a vinylether group and an acrylate group is 2-(2-vinylxyethoxy)ethylacrylate.

In a particular preferred embodiment, the radiation curable solder mask inkjet ink comprises a free radical polymerizable compound selected from the group consisting of neopentyl-glycol hydroxypivalate diacrylate, isobornyl acrylate, dipropylene glycol diacrylate, trimethylol propane triacrylate, and 2-(vinylethoxy)ethyl acrylate.

Colorants

The radiation curable solder mask inkjet ink may be a substantially colourless inkjet ink, but preferably the radiation curable inkjet includes at least one colorant.

The colorant in the solder mask inkjet ink may be a pigment or a dye, but is preferably a pigment.

A colour pigment may be chosen from those disclosed by HERBST, Willy, et al. Industrial Organic Pigments, Production, Properties, Applications, 3rd edition. Wiley—VCH, 2004, ISBN 3527305769.

Suitable pigments are disclosed in paragraphs [0128] to [0138] of WO2008/074548.

Pigment particles in inkjet inks should be sufficiently small to permit free flow of the ink through the inkjet-printing device, especially at the ejecting nozzles. It is also desirable to use small particles for maximum colour strength and to slow down sedimentation. Most preferably, the average pigment particle size is no larger than 150 nm. The average particle size of pigment particles is preferably determined with a Brookhaven Instruments Particle Sizer BI90plus based upon the principle of dynamic light scattering.

In PCBs, the solder mask typically has a blue or green colour. The blue pigment is preferably one of the phthalocyanine series. Examples of blue pigments are C.I. Pigment Blue 1, 15, 15:1, 15:2, 15:3, 15:4, 15:6, 16, 24 and 60.

Green pigments are generally a mixture of blue and yellow or orange pigments or may be green pigments per se, such as halogenated phthalocyanines, for example copper or nickel brominated phthalocyanine.

In a preferred embodiment, the colorant is present in an amount of 0.2 to 6.0 wt %, more preferably 0.5 to 2.5 wt %, based on the total weight of the radiation curable inkjet ink.

Polymeric Dispersants

If the colorant in the radiation curable solder mask inkjet ink is a pigment, then the inkjet ink preferably contains a dispersant, more preferably a polymeric dispersant, for dispersing the pigment.

Suitable polymeric dispersants are copolymers of two monomers but they may contain three, four, five or even more monomers. The properties of polymeric dispersants depend on both the nature of the monomers and their distribution in the polymer. Copolymeric dispersants preferably have the following polymer compositions:

statistically polymerized monomers (e.g. monomers A and B polymerized into ABBAABAB);

alternating polymerized monomers (e.g. monomers A and B polymerized into ABABABAB);

gradient (tapered) polymerized monomers (e.g. monomers A and B polymerized into AAABAABBABBB);

block copolymers (e.g. monomers A and B polymerized into AAAAAABBBBBB) wherein the block length of each of the blocks (2, 3, 4, 5 or even more) is important for the dispersion capability of the polymeric dispersant;

graft copolymers (graft copolymers consist of a polymeric backbone with polymeric side chains attached to the backbone); and mixed forms of these polymers, e.g. blocky gradient copolymers.

Suitable polymeric dispersants are listed in the section on "Dispersants", more specifically [0064] to [0070] and [0074] to [0077], in EP-A 1911814.

Commercial examples of polymeric dispersants are the following:

DISPERBYK™ dispersants available from BYK CHEMIE GMBH;
SOLSPERSE™ dispersants available from NOVEON;
TEGO™ DISPERS™ dispersants from EVONIK;
EDAPLAN™ dispersants from MÜJNZING CHEMIE;
ETHACRYL™ dispersants from LYONDELL;
GANEX™ dispersants from ISP;
DISPEX™ and EFKA™ dispersants from CIBA SPECIALTY CHEMICALS INC;
DISPONER™ dispersants from DEUCHEM; and
JONCRYL™ dispersants from JOHNSON POLYMER.

Photoinitiators and Photoinitiating Systems

The radiation curable solder mask inkjet ink preferably contains at least one photoinitiator, but may contain a photoinitiating system including a plurality of photoinitiators and/or co-initiators.

The photoinitiator in the radiation curable inkjet is preferably a free radical initiator, more specifically a Norrish type I initiator or a Norrish type II initiator. A free radical photoinitiator is a chemical compound that initiates polymerization of monomers and oligomers when exposed to actinic radiation by the formation of a free radical. A Norrish Type I initiator is an initiator which cleaves after excitation, yielding the initiating radical immediately. A Norrish type II-initiator is a photoinitiator which is activated by actinic radiation and forms free radicals by hydrogen abstraction from a second compound that becomes the actual initiating free radical. This second compound is called a polymerization synergist or co-initiator. Both type I and type II photoinitiators can be used in the present invention, alone or in combination.

Suitable photoinitiators are disclosed in CRIVELLO, J. V., et al. Photoinitiators for Free Radical Cationic and Anionic Photopolymerization. 2nd edition. Edited by BRADLEY, G. London, UK: John Wiley and Sons Ltd, 1998. p. 287-294.

Specific examples of photoinitiators may include, but are not limited to, the following compounds or combinations thereof: benzophenone and substituted benzophenones, 1-hydroxycyclohexyl phenyl ketone, thioxanthones such as isopropylthioxanthone, 2-hydroxy-2-methyl-1-phenylpropan-1-one, 2-benzyl-2-dimethylamino-(4-morpholinophenyl) butan-1-one, benzyl dimethylketal, bis (2,6-dimethylbenzoyl)-2,4,4-trimethylpentylphosphine oxide, 2,4,6 trimethylbenzoyldiphenylphosphine oxide, 2,4,6-trimethoxybenzoyldiphenylphosphine oxide 2-methyl-[4-(methylthio) phenyl]-2-morpholinopropan-1-one, 2,2-dimethoxy-1,2-diphenylethan-1-one or 5,7-diiodo-3-butoxy-6-fluorone.

Suitable commercial photoinitiators include Irgacure™ 184, Irgacure™ 500, Irgacure™ 369, Irgacure™ 1700, Irgacure™ 651, Irgacure™ 819, Irgacure™ 1000, Irgacure™ 1300, Irgacure™ 1870, Darocur™ 1173, Darocur™ 2959, Darocur™ 4:265 and Darocur™ ITX available from CIBA SPECIALTY CHEMICALS, Lucerin™ TPO available from BASF AG, Esacure™ KT046, Esacure™ KIP150, Esacure™ KT37 and Esacure™ EDB available from LAIMIBERTI, H-Nu™ 470 and H-Nu™ 470X available from SPECTRA GROUP Ltd.

The photoinitiator may be a so-called diffusion hindered photoinitiator. A diffusion hindered photoinitiator is a photoinitiator which exhibits a much lower mobility in a cured ink layer than a monofunctional photoinitiator, such as benzophenone. Several methods can be used to lower the mobility of the photoinitiator. One way is to increase the molecular weight of the photoinitiators so that the diffusion speed is reduced, e.g. polymeric photoinitiators. Another way is to increase its reactivity so that it is built into the polymerizing network, e.g. multifunctional photoinitiators (having 2, 3 or more photoinitiating groups) and polymerizable photoinitiators.

The diffusion hindered photoinitiator for the radiation curable inkjet is preferably selected from the group consisting of non-polymeric multifunctional photoinitiators, oligomeric or polymeric photoinitiators and polymerizable photoinitiators. Most preferably the diffusion hindered photoinitiator is a polymerizable initiator or a polymeric photoinitiator.

A preferred diffusion hindered photoinitiator contains one or more photoinitiating functional groups derived from a Norrish type I-photoinitiator selected from the group consisting of benzoyinethers, benzil ketals, α,α-dialkoxyacetophenones, α-hydroxyalkylphenones, α-aminoalkylphenones, acylphosphine oxides, acylphosphine sulphides, α-haloketones, α-halosulfones and phenylglyoxalates.

A preferred diffusion hindered photoinitiator contains one or more photoinitiating functional groups derived from a Norrish type II-initiator selected from the group consisting of benzophenones, thioxanthones, 1,2-diketones and anthraquinones.

Suitable diffusion hindered photoinitiators are also those disclosed in EP-A 2065362 in paragraphs [0074] and [0075] for difunctional and multifunctional photoinitiators, in paragraphs [0077] to [0080] for polymeric photoinitiators and in paragraphs [081] to [0083] for polymerizable photoinitiators.

A preferred amount of photoinitiator is 0.1-20 wt %, more preferably 2-15 wt %, and most preferably 3-10 wt % of the total weight of the radiation curable inkjet ink.

In order to increase the photosensitivity further, the radiation curable inkjet may additionally contain co-initiators. Suitable examples of co-initiators can be categorized in three groups: 1) tertiary aliphatic amines such as methyldiethanolamine, dimethylethanolamine, triethanolamine, triethylamine and N-methylmorpholine; (2) aromatic amines such as amylparadimethyl-aminobenzoate, 2-n-butoxyethyl-4-(dimethylamino)benzoate; 2-(dimethylamino)-ethylbenzoate, ethyl-4-(dimethylamino)benzoate, and 2-ethylhexyl-4-(dimethylamino)benzoate; and (3) (meth)acrylated amines such as dialkylamino alkyl(meth)acrylates (e.g., diethylaminoethylacrylate) or N-morpholinoalkyl-(meth)acrylates (e.g., N-morpholinoethyl-acrylate). The preferred co-initiators are aminobenzoates.

When one or more co-initiators are included into the radiation curable inkjet ink, preferably these co-initiators are diffusion hindered for safety reasons.

A diffusion hindered co-initiator is preferably selected from the group consisting of non-polymeric di- or multi-functional co-initiators, oligomeric or polymeric co-initiators and polymerizable co-initiators. More preferably the diffusion hindered co-initiator is selected from the group consisting of polymeric co-initiators and polymerizable co-initiators. Most preferably the diffusion hindered co-initiator is a polymerizable co-initiator having at least one (meth)acrylate group, more preferably having at least one acrylate group.

The radiation curable solder mask inkjet ink preferably includes a polymerizable or polymeric tertiary amine co-initiator.

Preferred diffusion hindered co-initiators are the polymerizable co-initiators disclosed in EP-A 2053101 in paragraphs [0088] and [0097].

The radiation curable solder mask inkjet ink preferably includes the (diffusion hindered) co-initiator in an amount of 0.1 to 20 wt %, more preferably in an amount of 0.5 to 15 wt %, most preferably in an amount of 1 to 10 wt % of the total weight of the radiation curable inkjet ink.

Polymerization Inhibitors

The radiation curable solder mask inkjet ink may contain at least one inhibitor for improving the thermal stability of the ink.

Suitable polymerization inhibitors include phenol type antioxidants, hindered amine light stabilizers, phosphor type antioxidants, hydroquinone monomethyl ether commonly used in (meth)acrylate monomers, and hydroquinone, t-butylcatechol, pyrogallol, 2,6-di-tert.butyl-4-methylphenol (=BHT) may also be used.

Suitable commercial inhibitors are, for example, Sumilizer™ GA-80, Sumilizer™ GM and Sumilizer™ GS produced by Sumitomo Chemical Co. Ltd.; Genorad™ 16, Genorad™18 and Genorad™ 20 from Rahn AG; Irgastab™UV10 and Irgastab™ UT22, Tinuvin™ 460 and CGS20 from Ciba Specialty Chemicals; Floorstab™ UV range (UV-1, UV-2, UV-5 and UV-8) from Kromachem Ltd, Additol™ S range (S100, S110, S120 and S130) from Cytec Surface Specialties.

The inhibitor is preferably a polymerizable inhibitor.

Since excessive addition of these polymerization inhibitors may lower the curing speed, it is preferred that the amount capable of preventing polymerization is determined prior to blending. The amount of a polymerization inhibitor is preferably lower than 5 wt %, more preferably lower than 3 wt % of the total radiation curable inkjet ink.

Surfactants

The radiation curable solder mask inkjet ink may contain at least one surfactant.

The surfactant can be anionic, cationic, non-ionic, or zwitter-ionic and is usually added in a total quantity less than 1 wt % based on the total weight of the radiation curable inkjet ink.

Suitable surfactants include fluorinated surfactants, fatty acid salts, ester salts of a higher alcohol, alkylbenzene sulfonate salts, sulfosuccinate ester salts and phosphate ester salts of a higher alcohol (for example, sodium dodecylbenzenesulfonate and sodium dioctylsulfosuccinate), ethylene oxide adducts of a higher alcohol, ethylene oxide adducts of an alkylphenol, ethylene oxide adducts of a polyhydric alcohol fatty acid ester, and acetylene glycol and ethylene oxide adducts thereof (for example, polyoxyethylene nonylphenyl ether, and SURFYNOL™ 104, 104H, 440, 465 and TG available from AIR PRODUCTS & CHEMICALS INC.).

Preferred surfactants are selected from fluoric surfactants (such as fluorinated hydrocarbons) and silicone surfactants. The silicone surfactants are preferably siloxanes and can be alkoxylated, polyether modified, polyether modified hydroxy functional, amine modified, epoxy modified and other modifications or combinations thereof. Preferred siloxanes are polymeric, for example polydimethylsiloxanes.

Preferred commercial silicone surfactants include BYK™ 333 and BYK™ UV3510 from BYK Chemie.

In a preferred embodiment, the surfactant is a polymerizable compound.

Preferred polymerizable silicone surfactants include a (meth)acrylated silicone surfactant. Most preferably the (meth)acrylated silicone surfactant is an acrylated silicone surfactant, because acrylates are more reactive than methacrylates.

In a preferred embodiment, the (meth)acrylated silicone surfactant is a polyether modified (meth)acrylated polydimethylsiloxane or a polyester modified (meth)acrylated polydimethyl siloxane.

Preferably the surfactant is present in the radiation curable inkjet ink in an amount of 0 to 3 wt % based on the total weight of the radiation curable inkjet ink.

Flame Retardant

The radiation curable solder mask inkjet ink may further contain a flame retardant. In principle all known flame retardants may be used. However, the flame retardant is preferably not a halogen containing compound.

Preferred flame retardants are inorganic flame retardants, such as Alumina Trihydrate and Boehmite, and organo-phosphor compounds, such as organo-phosphates (e.g. triphenyl phosphate (TPP), resorcinol bis (diphenylphosphate) (RDP), bisphenol A diphenyl phosphate (BADP) and tricresyl phosphate (TCP)); organo-phosphonates (e.g. dimethyl methylphosphonate (DMMP)); and organo-phosphinates (e.g. aluminium diethyl phosphinate).

Other preferred organo-phosphor compounds are disclosed in U.S. Pat. No. 8,273,805.

Preparation of Inkjet Inks

The preparation of pigmented radiation curable inkjet inks is well-known to the skilled person. Preferred methods of preparation are disclosed in paragraphs [0076] to [0085] of WO2011/069943.

Inkjet Printing Devices

The radiation curable inkjet ink may be jetted by one or more print heads ejecting small droplets in a controlled manner through nozzles onto a substrate, which is moving relative to the print head(s).

A preferred print head for the inkjet printing system is a piezoelectric head. Piezoelectric inkjet printing is based on the movement of a piezoelectric ceramic transducer when a voltage is applied thereto. The application of a voltage changes the shape of the piezoelectric ceramic transducer in the print head creating a void, which is then filled with ink. When the voltage is again removed, the ceramic expands to its original shape, ejecting a drop of ink from the print head. However the inkjet printing method according to the present invention is not restricted to piezoelectric inkjet printing. Other inkjet print heads can be used and include various types, such as a continuous type.

The inkjet print head normally scans back and forth in a transversal direction across the moving ink-receiver surface. Often the inkjet print head does not print on the way back. Bi-directional printing is preferred for obtaining a high areal throughput. Another preferred printing method is by a "single pass printing process", which can be performed by using page wide inkjet print heads or multiple staggered inkjet print heads which cover the entire width of the ink-receiver surface. In a single pass printing process the inkjet print heads usually remain stationary and the ink-receiver surface is transported under the inkjet print heads.

Curing Devices

The radiation curable inkjet ink can be cured by exposing them to actinic radiation, such as electron beam or ultraviolet radiation. Preferably the radiation curable inkjet ink is cured by ultraviolet radiation, more preferably using UV LED curing.

In inkjet printing, the curing means may be arranged in combination with the print head of the inkjet printer, travelling therewith so that the curable liquid is exposed to curing radiation very shortly after been jetted.

In such an arrangement, with the exception of UV LEDs, it can be difficult to provide a small enough radiation source connected to and travelling with the print head. Therefore, a static fixed radiation source may be employed, e.g. a source of curing UV-light, connected to the radiation source by means of flexible radiation conductive means such as a fibre optic bundle or an internally reflective flexible tube.

Alternatively, the actinic radiation may be supplied from a fixed source to the radiation head by an arrangement of mirrors including a mirror upon the radiation head.

The source of radiation may also be an elongated radiation source extending transversely across the substrate to be cured. It may be adjacent the transverse path of the print head so that the subsequent rows of images formed by the print head are passed, stepwise or continually, beneath that radiation source.

Any ultraviolet light source, as long as part of the emitted light can be absorbed by the photo-initiator or photo-initiator system, may be employed as a radiation source, such as, a high or low pressure mercury lamp, a cold cathode tube, a black light, an ultraviolet LED, an ultraviolet laser, and a flash light. Of these, the preferred source is one exhibiting a relatively long wavelength UV-contribution having a dominant wavelength of 300-400 nm. Specifically, a UV-A light source is preferred due to the reduced light scattering therewith resulting in more efficient interior curing.

UV radiation is generally classed as UV-A, UV-B, and UV-C as follows:
UV-A: 400 nm to 320 nm
UV-B: 320 nm to 290 nm
UV-C: 290 nm to 100 nm.

In a preferred embodiment, the radiation curable inkjet ink is cured by UV LEDs. The inkjet printing device preferably contains one or more UV LEDs preferably with a wavelength larger than 360 nm, preferably one or more UV LEDs with a wavelength larger than 380 nm, and most preferably UV LEDs with a wavelength of about 395 nm.

Furthermore, it is possible to cure the ink image using, consecutively or simultaneously, two light sources of differing wavelength or illuminance. For example, the first UV-source can be selected to be rich in UV-C, in particular in the range of 260 nm-200 nm. The second UV-source can then be rich in UV-A, e.g. a gallium-doped lamp, or a different lamp high in both UV-A and UV-B. The use of two UV-sources has been found to have advantages e.g. a fast curing speed and a high curing degree.

For facilitating curing, the inkjet printing device often includes one or more oxygen depletion units. The oxygen depletion units place a blanket of nitrogen or other relatively inert gas (e.g. $CO_2$), with adjustable position and adjustable inert gas concentration, in order to reduce the oxygen concentration in the curing environment. Residual oxygen levels are usually maintained as low as 200 ppm, but are generally in the range of 200 ppm to 1200 ppm.

EXAMPLES

Materials

All materials used in the following examples were readily available from standard sources such as ALDRICH CHEMICAL Co. (Belgium) and ACROS (Belgium) unless otherwise specified. The water used was deionized water.

CTFA is a cyclic trimethylpropane formal acrylate available as Sartomer™ SR531 from ARKEMA.

ACMO is acryloyl morpholine available from RAHN.

CD420 is a monofunctional acrylic monomer available as Sartomer™ CD420 from ARKEMA.

TMPTA is trimethylolpropane triacrylate available as Sartomer™ SR531 from ARKEMA.

ITX is Speedcure™ ITX, a mixture of isopropyl thioxanthone isomers, from LAMBSON SPECIALTY CHEMICALS.

TPO is 2,4,6-trimethylbenzoyldiphenylphosphine oxide, supplied by RAHN AG.

EPD is ethyl-4-(dimethylamino)benzoate, available under the trade name of Genocure M EPD from RAHN AG.

BAPO is a bis(2,4,6-trimethybenzoyl)-phenylphoshineoxide photoinitiator available as Irgacure™ 819 from BASF.

INHIB is a mixture forming a polymerization inhibitor having a composition according to Table 4.

TABLE 4

| Component | wt % |
| --- | --- |
| DPGDA | 82.4 |
| p-methoxyphenol | 4.0 |
| 2,6-di-tert-butyl-4-methylphenol | 10.0 |
| Cupferron ™ AL | 3.6 |

Cupferron™ AL is aluminum N-nitrosophenylhydroxylamine from WAKO CHEMICALS LTD.

Ebecryl 1360 AK is a polysiloxane hexa acrylate slip agent from ALLNEX.

DPGDA is dipropylenediacrylate, available as Sartomer SR508 from ARKEMA.

VEEA is 2-(vinylethoxy)ethyl acrylate available from NIPPON SHOKUBAI, Japan.

Cyan is SUN FAST BLUE 15:4, a cyan pigment available from SUN CHEMICALS.

Yellow is CROMOPHTAL, YELLOW D 1085J, a yellow pigment from BASF.

Disperbyk 162 is a dispersing agent and has been precipitated from a solution available from BYK (ALTANA).

PHEN-19 is bis(4-hydroxy-3-methylphenyl)methane, available as PP-BIOC-F from DKSH.

PHEN-06 is bisphenol E (1,1-bis(4-hydroxyphenyl) ethane from Aldrich.

PHEN-02 is bisphenol A (2,2-Bis(4-hydroxyphenyl) propane) from Aldrich.

RESIN-01 is a branched poly(4-hydroxystyrene) available as PBS from HYDRITE CHEMICAL COMPANY.

PHEN-05 is 1,1'-bis(4-hydroxy-3-methylphenyl) ethane available as BIOC-E from DKSH.

NOVOLAC-1, is a novolac resin available as PR NMD 103 from SUMITOMO.

NOVOLAC-2, is a novolac resin available as PR D 104 from SUMITOMO.

NOVOLAC-3, is a novolac resin available as AV Lite Resin SP1006N from SIBER HEGNER.

NOVOLAC-4, is a novolac resin available as Durite D_PD-126A from BORDEN.

NOVOLAC-5, is a novolac resin available as Durez 33100 DUREZ PLASTICS.

NOVOLAC-6, is a novolac resin available as PR NMD 204 from BORDEN.

PHEN-03 is Bisphenol S available from ACROS.

PHEN-07 is Bis-(4-hydroxyphenyl) sulfide from TCI EUROPE.

PHEN-08 is 4,4'-oxydiphenol from ACROS.

ADH-01 is 2-carboxyethylacrylate from BIMAX CHEMICALS.

Carbothiazol from FEW.

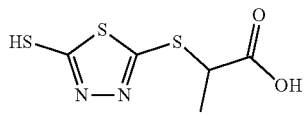

CN146 is 2-acryloyloxyethyl hydrogen phthalate from ARKEMA.

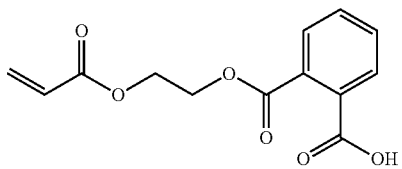 [SMILES: C=CC(=O)OCCOC(=O)c1ccccc1C(=O)O]

Mercaptosuccinic acid from Aldrich.

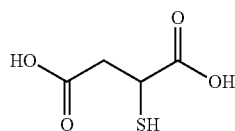

Silane Z-6040 is glycidoxypropyltrimethoxysilane from DOW CORNING.

CN823 is an acrylic oligomer and monomer blend available as SARTOMER CN 823 from ARKEMA.

Methods

Coatings/Prints of the Solder Mask Inkjet Inks

To evaluate the adhesion and the solder resistance of the solder mask inkjet inks, the inks were coated on a brushed copper foil (35μ) at a coating thickness of 20μ and cured using a H-bulb (1 pass at 20 m/min). Additionally, the coatings were thermally cured at 150° C. during 30 minutes.

Evaluation Solder Resistance

The solder resistance of the solder mask inkjet inks was evaluated using a SPL600240 Digital Dynamic Solder Pot available from L&M PROODUCTS filled with a "K" Grade 63:37 tin/lead solder available from SOLDER CONNECTION. The temperature of the solder was set at 290° C. 0175 Using a Q-tip, a solder flux SC7560A from SOLDER CONNECTION was applied on the surface of the samples (i.e. coatings of the solder mask inkjet ink on a copper surface) to clean the surface. The solder flux was dried by placing the samples for 10 minutes above the solder pot.

After placing the sample in the solder pot, a solder wave was created for 10 seconds after which the samples were cooled for at least 10 minutes.

The adhesion of the solder mask inkjet inks on the copper surface was then evaluated by a cross-cut test according to ISO2409:1992 (E), as described below.

Adhesion

The adhesion was evaluated by a cross-cut test according to ISO2409:1992 (E). Paints (International standard 1992-08-15) using a Braive No. 1536 Cross Cut Tester from BRAIVE INSTRUMENTS with spacing of a 1 mm between cuts and using a weight of 600 g, in combination with a Tesatape™ 4104 PVC tape. The evaluation was made in accordance with a criterion described in Table 5, where both the adhesion in the cross-cut and outside the cross-cut were evaluated.

TABLE 5

| Evaluation value | Criterion |
| --- | --- |
| 0 | Nothing removed, perfect adhesion. |
| 1 | Detachment of only very small parts of the cured layer, almost perfect adhesion. |
| 2 | Minor parts of the cured layer was removed by the tape, good adhesion |
| 3 | Parts of the cured layer were removed by the tape, poor adhesion. |
| 4 | Most of the cured layer was removed by the tape, poor adhesion. |
| 5 | The cured layer was completely removed from the substrate by the tape, no adhesion. |

Viscosity

The viscosity of the inks was measured at 45° C. and at a shear rate of 1 000 s$^{-1}$ using a "Robotic Viscometer Type VISCObot" from CAMBRIDGE APPLIED SYSTEMS.

For industrial ink-et printing, the viscosity at 45° C. and at a shear rate of 1000 s$^{-1}$ is preferably between 3 and 20 mPa·s. More preferably the viscosity at 45° C. and at a shear rate of 1000 s$^{-1}$ is less than 15 mPa·s.

Solvent Resistance

The coatings described above were dipped in a beaker containing the solvent at a temperature of and for a time as described in the Table 6, followed by drying for 10 minutes. The dipped coatings were then evaluated for color change, blistering, degradation, swelling and cracking.

TABLE 6

| Solvent | Dipping Temp (° C.) and Time (min) |
| --- | --- |
| isopropyl alcohol (IPA) | 25° C.-2 minutes |
| 75 wt % IPA/25 wt % water | 46° C.-15 minutes |
| monoethanolamine | 57° C.-2 minutes |
| water | 60° C.-2 minutes |
| methylenechloride | 25° C.-1 minute |
| 10% HCl | 25° C.-60 minutes |
| 10% NaOH | 25° C.-60 minutes |

Preparation of the Cyan and Yellow Pigment Dispersions CPD and YPD

Concentrated Cyan and Yellow and pigment dispersions, respectively CPD and YPD, were prepared having a composition according to Table 7.

TABLE 7

| wt % of: | CPD | YPD |
|---|---|---|
| Cyan | 15 | – |
| Yellow | – | 15 |
| Disperbyk 162 | 15 | = |
| INHIB | 1 | = |
| VEEA | 69 | = |

CPD and YPD were prepared as follows: 138 g of 2-(2-vinyloxyethoxy)ethyl acrylate, 2 g of a solution containing 4 wt % of 4-methoxyphenol, 10 wt % of 2,6-Di-tert-butyl-4-methylphenol and 3.6 wt % of Aluminum-N-nitroso phenylhydroxyl amine in dipropylene glycol diacrylate, 200 g of a 30 wt % solution of Disperbyk 162 in 2-(2-vinyloxythoxy)ethyl acrylate and 60 g of Cyan (for CPD) or 60 g of Yellow (for YPD) were mixed using a DISPERLUX™ dispenser. Stirring was continued for 30 minutes. The vessel was connected to a NETZSCH MiniZeta mill filled with 900 g of 0.4 mm yttrium stabilized zirconia beads ("high wear resistant zirconia grinding media" from TOSOH Co.). The mixture was circulated over the mill for 120 minutes (residence time of 45 minutes) and a rotation speed in the mill of about 10.4 m/s. During the complete milling procedure the content in the mill was cooled to keep the temperature below 60° C. After milling, the dispersion was discharged into a vessel.

The resulting concentrated pigment dispersions CPD and YPD exhibited an average particle size of respectively 80 nm and 131 nm, as measured with a Malvern™ nano-S, and a viscosity of respectively 51 mPa·s and 11.4 mPa·s at 25° C. and at a shear rate of 10 s$^{-1}$.

Example 1

Preparation of Comparative Ink COMP-01 to COMP-08 and Inventive Inks INV-01 to INV-5

The comparative radiation curable inkjet ink COMP-01 to COMP-08 and the inventive radiation curable inkjet inks INV-01 to INV-05 were prepared according to Table 8. The weight percentages (wt %) are all based on the total weight of the radiation curable inkjet ink.

TABLE 8

| wt % of component | INV-01 | COMP-01 | INV-02 | COMP-02 | COMP-03 | INV-03 | COMP-04 |
|---|---|---|---|---|---|---|---|
| CPD | 2.50 | = | = | = | = | = | = |
| YPD | 2.50 | = | = | = | = | = | = |
| CTFA | 20.0 | = | = | = | = | = | = |
| VEEA | 27.0 | = | = | = | = | = | = |
| ACMO | 5.0 | = | = | = | = | = | = |
| CD420 | 15.0 | = | = | = | = | = | = |
| TMPTA | 5.0 | = | = | = | = | = | = |
| ITX | 3.0 | = | = | = | = | = | = |
| TPO | 3.0 | = | = | = | = | = | = |
| EPD | 4.0 | = | = | = | = | = | = |
| BAPO | 2.0 | = | = | = | = | = | = |
| PHEN-19 | 5.0 | 5.0 | — | — | — | — | — |
| PHEN-06 | — | — | 5.0 | 5.0 | 5.0 | — | — |
| PHEN-02 | — | — | — | — | — | 5.0 | 5.0 |
| ADH-01 | 5.0 | — | 5.0 | — | — | 5.0 | — |
| Carbothiadiazole | — | — | — | — | — | — | — |
| CN146 | — | — | — | 5.0 | — | — | — |
| Mercaptosuccinic acid | — | 5.0 | — | — | 5.0 | — | — |
| Silane Z-6040 | — | — | — | — | — | — | — |
| CN823 | — | — | — | — | — | — | 5.0 |
| Ebecryl 1360 AK | 0.1 | = | = | = | = | = | = |
| INHIB | 0.9 | = | = | = | = | = | = |

| wt % of component | INV-04 | COMP-05 | COMP-06 | COMP-07 | INV-05 | COMP-08 | INV-06 |
|---|---|---|---|---|---|---|---|
| CPD | 2.50 | = | = | = | = | = | = |
| YPD | 2.50 | = | = | = | = | = | = |
| CTFA | 20.0 | = | = | = | = | = | = |
| VEEA | 27.0 | = | = | = | = | 32.0 | = |
| ACMO | 5.0 | = | = | = | = | = | = |
| CD420 | 15.0 | = | = | = | = | = | = |
| TMPTA | 5.0 | = | = | = | = | = | = |
| ITX | 3.0 | = | = | = | = | = | = |
| TPO | 3.0 | = | = | = | = | = | = |
| EPD | 4.0 | = | = | = | = | = | = |
| BAPO | 2.0 | = | = | = | = | = | = |
| PHEN-05 | 5.0 | 5.0 | 5.0 | 5.0 | — | — | — |
| RESIN-01 | — | — | — | — | 5.0 | — | 5.0 |
| ADH-01 | 5.0 | — | — | — | 5.0 | 5.0 | — |
| ADH-11 | — | — | — | — | — | — | 5.0 |
| Carbothiadiazole | — | — | — | — | — | — | — |
| CN146 | — | 5.0 | — | — | — | — | — |
| Silane Z-6040 | — | — | 5.0 | — | — | — | — |
| CN823 | — | — | — | 5.0 | — | — | — |
| Ebecryl 1360 AK | 0.1 | = | = | = | = | = | = |
| INHIB | 0.9 | = | = | = | = | = | = |

The solder resistance and the solvent resistance of the comparative inks COMP-01 to COMP-08 and the inventive inks INV-1 to INV-06 were tested as described above. The results are shown in Table 9.

TABLE 9

| UV curable ink jet ink | Solder Resistance | Solvent Resistance |
|---|---|---|
| INV-01 | 1 | OK |
| COMP-01 | 5 | NOK |
| INV-02 | 1 | OK |
| COMP-02 | 2 | OK |
| COMP-03 | 1 | NOK |
| INV-03 | 1 | OK |
| COMP-04 | 3 | OK |
| INV-04 | 0 | OK |
| COMP-05 | 2 | NOK |
| COMP-06 | 0 | NOK |
| COMP-07 | 1 | NOK |
| INV-05 | 0 | OK |
| COMP-08 | 3 | — |
| INV-06 | 0 | OK |

It is clear from the results of Table 9 that the inventive solder mask inkjet inks all have very good superior solder resistance and solvent resistance compared to the comparative solder mask inkjet inks.

Example 2

Preparation of the Inventive Inks INV-07 to INV-15

The inventive radiation curable inkjet inks INV-07 to INV-15 were prepared according to Table 10. The weight percentages (wt %) are all based on the total weight of the radiation curable inkjet ink.

TABLE 10

| wt % of component | INV-06 | INV-07 | INV-08 | INV-09 | INV-10 |
|---|---|---|---|---|---|
| CPD | 2.50 | = | = | = | = |
| YPD | 2.50 | = | = | = | = |
| CTFA | 20.0 | = | = | = | = |
| VEEA | 27.0 | = | = | = | = |
| ACMO | 5.0 | = | = | = | = |
| CD420 | 15.0 | = | = | = | = |
| TMPTA | 5.0 | = | = | = | = |
| ITX | 3.0 | = | = | = | = |
| TPO | 3.0 | = | = | = | = |
| EPD | 4.0 | = | = | = | = |
| BAPO | 2.0 | = | = | = | = |
| NOVOLAC-1 | 5.0 | – | – | – | – |
| NOVOLAC-2 | – | 5.0 | – | – | – |
| NOVOLAC-3 | – | – | 5.0 | – | – |
| NOVOLAC-4 | – | – | – | 5.0 | – |
| NOVOLAC-5 | – | – | – | – | 5.0 |
| ADH-01 | 5.0 | = | = | = | = |
| Ebecryl 1360 AK | 0.1 | = | = | = | = |
| INHIB | 0.9 | = | = | = | = |

| wt % of component | INV-11 | INV-12 | INV-13 | INV-14 |
|---|---|---|---|---|
| CPD | 2.50 | = | = | = |
| YPD | 2.50 | = | = | = |
| CTFA | 20.0 | = | = | = |
| VEEA | 27.0 | = | = | = |
| ACMO | 5.0 | = | = | = |
| CD420 | 15.0 | = | = | = |
| TMPTA | 5.0 | = | = | = |
| ITX | 3.0 | = | = | = |
| TPO | 3.0 | = | = | = |
| EPD | 4.0 | = | = | = |
| BAPO | 2.0 | = | = | = |
| NOVOLAC-6 | 5.0 | – | – | – |

TABLE 10-continued

| PHEN-03 | – | 5.0 | – | – |
|---|---|---|---|---|
| PHEN-07 | – | – | 5.0 | – |
| PHEN-08 | – | – | – | 5.0 |
| ADH-01 | 5.0 | = | = | = |
| Ebecryl 1360 AK | 0.1 | = | = | = |
| INHIB | 0.9 | = | = | = |

The solder resistance and the solvent resistance of the inventive inks INV-06 to INV-14 were described above. The results are shown in Table 11.

TABLE 11

| UV curable ink jet ink | Solder Resistance | Solvent Resistance |
|---|---|---|
| INV-06 | 0 | OK |
| INV-07 | 0 | OK |
| INV-08 | 0 | OK |
| INV-09 | 1 | OK |
| INV-10 | 1 | OK |
| INV-11 | 0 | OK |
| INV-12 | 0 | OK |
| INV-13 | 0 | OK |
| INV-14 | 0 | OK |

It is clear from the results of Table 11 that the inventive solder mast inkjet inks all have very good superior solder resistance and solvent resistance.

The invention claimed is:

1. A radiation curable solder mask inkjet ink comprising:
a polymerizable compound;
an adhesion promoter; and
a phenolic compound including at least two phenolic groups; wherein
the adhesion promoter has a chemical structure according to Formula I, or a salt thereof:

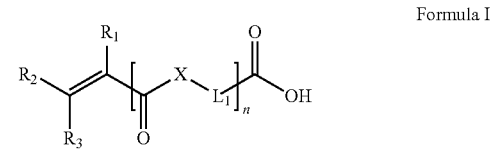

Formula I wherein
n is 0 or 1;
$R_1$ is selected from the group consisting of a hydrogen atom, a substituted or unsubstituted alkyl group, and a substituted or unsubstituted aryl group;
$L_1$ represents a divalent linking group including 20 carbon atoms or less in which $L_1$ is linked to carboxylic acid via an aliphatic carbon atom;
X represents O or $NR_4$;
$R_4$ is selected from the group consisting of a hydrogen atom, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted (hetero)aryl group;
$R_4$ and $L_1$ may represent atoms that form a 5 to 8 membered ring;
$R_2$ and $R_3$ are independently selected from the group consisting of hydrogen, a substituted or unsubstituted alkyl group, a substituted or unsubstituted aryl group, and a substituted or unsubstituted heteroaryl group.

2. The radiation curable solder mask inkjet ink according to claim 1, wherein $R_1$ is a hydrogen atom or a methyl group.

3. The radiation curable solder mask inkjet ink according to claim 1, wherein X is an oxygen atom or NH.

4. The radiation curable solder mask inkjet ink according to claim 1, wherein $L_1$ represents a substituted or unsubstituted alkylene group.

5. The radiation curable solder mask inkjet ink according to claim 1, wherein the phenolic compound has a structure according to Formula II:

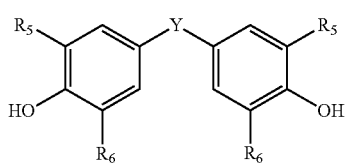

Formula II wherein
$R_5$ and $R_6$ are independently selected from the group consisting of a hydrogen atom, a substituted or unsubstituted alkyl group, a hydroxyl group, and a substituted or unsubstituted alkoxy group;
Y is selected from the group consisting of $CR_7R_8$, $SO_2$, SO, S, O, and CO;
$R_7$ and $R_8$ are independently selected from the group consisting of a hydrogen atom, a substituted or unsubstituted alkyl group, a substituted or unsubstituted alkenyl group, a substituted or unsubstituted alkynyl group, a substituted or unsubstituted alkaryl group, a substituted or unsubstituted aralkyl group, and a substituted or unsubstituted (hetero)aryl group; and
$R_7$ and $R_8$ may represent atoms that form a 5 to 8 membered ring.

6. The radiation curable solder mask inkjet ink according to claim 5, wherein Y is $CR_7R_8$ or $SO_2$, and $R_7$ and $R_8$ represent a hydrogen atom or an alkyl group.

7. The radiation curable solder mask inkjet ink according to claim 1, wherein the phenolic compound is a phenolic resin or a hydroxystyrene based resin.

8. The radiation curable solder mask inkjet ink according to claim 1, wherein an amount of the adhesion promoter is between 0.5 and 20 wt % relative to a total weight of the inkjet ink.

9. The radiation curable solder mask inkjet ink according to claim 1, wherein an amount of the phenolic compound is between 0.5 and 20 wt % relative to a total weight of the inkjet ink.

10. The radiation curable solder mask inkjet ink according to claim 1, wherein the polymerizable compound is selected from the group consisting of neopentyl glycol hydroxypivalate diacrylate, isobornyl acrylate, dipropylene glycol diacrylate, trimethylol propane triacrylate, and 2-(vinylethoxy) ethyl acrylate.

11. The radiation curable solder mask inkjet ink according to claim 1, further comprising a cyan pigment, a yellow pigment, or a green pigment.

12. A method of manufacturing an electronic device, the method comprising:
jetting a radiation curable solder mask inkjet ink as defined in claim 1 onto a dielectric substrate including an electrically conductive pattern; and
curing the jetted solder mask inkjet ink.

13. The method according to claim 12, wherein the step of curing is performed using UV radiation.

14. The method according to claim 12, further comprising:
heating the jetted solder mask inkjet ink.

15. The method according to claim 12, wherein the electronic device is a printed circuit board.

* * * * *